(12) United States Patent
Choi

(10) Patent No.: US 10,608,001 B2
(45) Date of Patent: Mar. 31, 2020

(54) NONVOLATILE MEMORY DEVICES HAVING A LATERAL COUPLING STRUCTURE AND A SINGLE LAYER GATE

(71) Applicant: SK hynix system ic Inc., Chungcheongbuk-do (KR)

(72) Inventor: Kwang Il Choi, Chungcheongbuk-do (KR)

(73) Assignee: SK hynix system ic Inc., Chungcheongbuk-do (KR)

( * ) Notice: Subject to any disclaimer, the term of this patent is extended or adjusted under 35 U.S.C. 154(b) by 0 days.

(21) Appl. No.: 16/212,329

(22) Filed: Dec. 6, 2018

(65) Prior Publication Data
US 2019/0267388 A1  Aug. 29, 2019

(30) Foreign Application Priority Data
Feb. 23, 2018  (KR) .................. 10-2018-0022198

(51) Int. Cl.
| | | |
|---|---|---|
| *H01L 27/11524* | (2017.01) | |
| *G11C 16/04* | (2006.01) | |
| *H01L 29/788* | (2006.01) | |
| *H01L 29/66* | (2006.01) | |
| *G11C 16/10* | (2006.01) | |
| *G11C 16/26* | (2006.01) | |
| *G11C 16/24* | (2006.01) | |
| *G11C 16/14* | (2006.01) | |
| *G11C 16/08* | (2006.01) | |

(52) U.S. Cl.
CPC .... *H01L 27/11524* (2013.01); *G11C 16/0433* (2013.01); *H01L 29/66825* (2013.01); *H01L 29/7885* (2013.01); *G11C 16/08* (2013.01); *G11C 16/10* (2013.01); *G11C 16/14* (2013.01); *G11C 16/24* (2013.01); *G11C 16/26* (2013.01)

(58) Field of Classification Search
CPC .......... G11C 16/0433; H01L 27/11521; H01L 27/11524
See application file for complete search history.

(56) References Cited

U.S. PATENT DOCUMENTS

2015/0069486 A1* 3/2015 Park .................. H01L 27/11521
257/315

FOREIGN PATENT DOCUMENTS

| KR | 1020160051175 | 5/2016 |
|---|---|---|
| KR | 1020170092770 | 8/2017 |

* cited by examiner

*Primary Examiner* — Daniel P Shook
(74) *Attorney, Agent, or Firm* — IP & T Group LLP

(57) ABSTRACT

A nonvolatile memory device includes a plurality of unit cells. Each of the plurality of unit cells includes a first active region disposed in a substrate to extend in a first direction, a floating gate extending in a second direction to cross over the first active region, a first selection gate disposed to be adjacent to a first side surface of the floating gate to cross over the first active region, a second selection gate disposed to be adjacent to a second side surface of the floating gate opposite to the first selection gate to cross over the first active region, a first dielectric layer disposed between the floating gate and the first selection gate, and a second dielectric layer disposed between the floating gate and the second selection gate.

20 Claims, 15 Drawing Sheets

NONVOLATILE MEMORY DEVICES HAVING A LATERAL COUPLING STRUCTURE AND A SINGLE LAYER GATE

CROSS-REFERENCES TO RELATED APPLICATIONS

The present application claims priority under 35 U.S.C 119(a) to Korean Application No. 10-2018-0022198, filed on Feb. 23, 2018, which is herein incorporated by references in its entirety.

BACKGROUND

1. Technical Field

Various embodiments of the present disclosure generally relate to nonvolatile memory devices and, more particularly, to nonvolatile memory devices having a lateral coupling structure and a single-layer gate.

2. Related Art

Nonvolatile memory devices retain their stored data even when power supply is interrupted. Various cell structures and cell array schemes have been proposed for improving the performance of nonvolatile memory devices. A unit memory cell of a typical nonvolatile memory device may employ a stack gate structure including a gate insulation layer (also, referred to as a tunnel insulation layer), a floating gate, an inter-gate dielectric layer and a control gate which are sequentially stacked on a semiconductor substrate.

Recently, as electronic systems become smaller with the development of fabrication techniques of semiconductor devices, system-on-chip (SOC) products have been revealed and utilized as important devices of high performance digital systems. Each of the SOC products may include a plurality of semiconductor devices executing various functions in a single chip. For example, the SOC product may include at least one logic device and at least one memory device which are integrated in a single chip. Thus, fabrication technologies of embedded nonvolatile memory devices may be required to embed the nonvolatile memory devices in the SOC products.

In order to embed the nonvolatile memory devices in the SOC products, the process technology of the nonvolatile memory devices has to be compatible with the process technology of the logic device included in the SOC products. In general, the logic devices employ transistors having a single gate structure, whereas the nonvolatile memory devices employ cell transistors having a stack gate structure (i.e., a double gate structure). Thus, a complicate process technology may be required to fabricate the SOC products including the nonvolatile memory devices and the logic devices. Accordingly, nonvolatile memory devices employing a single-layer gate cell structure are very attractive as a candidate of the embedded nonvolatile memory devices. That is, complementary metal-oxide-semiconductor (CMOS) process technologies for fabricating the logic devices may be readily applied to fabrication of the nonvolatile memory devices employing the single-layer gates. As a result, if the SOC products are designed to include the nonvolatile memory devices employing a single-layer gate cell structure, the SOC products may be readily fabricated using the CMOS process technologies.

SUMMARY

In accordance with an embodiment, a nonvolatile memory device includes a first active region disposed in a substrate to extend in a first direction, a floating gate extending in a second direction to cross over the first active region, a first selection gate disposed to be adjacent to a first side surface of the floating gate to cross over the first active region, a second selection gate disposed to be adjacent to a second side surface of the floating gate opposite to the first selection gate to cross over the first active region, a first dielectric layer disposed between the first side surface of the floating gate and a first side surface of the first selection gate, and a second dielectric layer disposed between the second side surface of the floating gate and a first side surface of the second selection gate.

In accordance with an embodiment, a nonvolatile memory device includes a plurality of unit cells which are respectively located at cross points of a plurality of rows and a plurality of columns. Each of the plurality of unit cells includes a first selection transistor, a second selection transistor and a storage transistor. The first selection transistor has a source terminal coupled to a source line, a drain terminal coupled to a first junction terminal, and a first selection gate terminal coupled to a word line. The second selection transistor has a source terminal coupled to a second junction terminal, a drain terminal coupled to a bit line, and a second selection gate terminal coupled to the word line. The storage transistor has a floating gate terminal of a floated single-layer gate, a source terminal coupled to the first junction terminal, and a drain terminal coupled to the second junction terminal. A vertical capacitive component is provided to have a first terminal coupled to the floating gate terminal and a second terminal coupled to an erasure terminal. A first lateral coupling capacitive component is provided to have a first terminal coupled to the first selection gate terminal and a second terminal coupled to the floating gate terminal. A second lateral coupling capacitive component is provided to have a first terminal coupled to the second selection gate terminal and a second terminal coupled to the floating gate terminal.

In accordance with an embodiment, a nonvolatile memory device includes first active regions extending in a first direction and being disposed to be spaced apart from each other in a second direction intersecting the first direction. Plural groups of second active regions are disposed between the first active regions. Each group of second active regions are arrayed in the first direction in any one of spaces between the first active regions. Floating gates are arrayed in the first direction to intersect each of the first active regions. First ends of two adjacent ones of the floating gates extend in the second direction to overlap with any one of the second active regions. The floating gates intersecting one of the first active regions are spaced apart from the floating gates intersecting another one of the first active regions. First selection gates extending in the second direction are provided. Each of the first selection gates is disposed at first sides of the floating gates arrayed on a straight line to intersect all of the first active regions. Second selection gates extending in the second direction are provided. Each of the second selection gates is disposed at second sides of the floating gates arrayed on the straight line to intersect all of the first active regions and some of the second active regions. Conductive connection lines are arrayed in the first direction. Each of the conductive connection lines connects the first selection gate and the second selection gate, which are respectively disposed at both sides of each of the floating gates, to each other.

In accordance with an embodiment, a nonvolatile memory device includes first active regions extending in a first direction and being disposed to be spaced apart from each other in a second direction intersecting the first direction. Plural groups of second active regions are disposed between the first active regions. Each group of second active regions are arrayed in the first direction in any one of spaces between the first active regions. Floating gates are arrayed in the first direction to intersect each of the first active regions. First ends of two adjacent ones of the floating gates extend in the second direction to overlap with any one of the second active regions, and the floating gates intersecting one of the first active regions are spaced apart from the floating gates intersecting another one of the first active regions. First selection gates extending in the second direction are provided. Each of the first selection gates is disposed at first sides of the floating gates arrayed on a straight line to intersect all of the first active regions. Second selection gates extending in the second direction are provided. Each of the second selection gates is disposed at a second side of any one of the floating gates arrayed on the straight line to intersect any one of the first active regions without overlapping with the second active regions. Conductive connection lines are arrayed in the first direction. Each of the conductive connection lines connects the first selection gate and the second selection gate, which are respectively disposed at the first and second sides of each of the floating gates intersecting a first one of the first active regions, to each other. Additional conductive connection lines are provided. Each of the additional conductive connection lines connects one of the first selection gates to any one of the second selection gates intersecting the second one to a last one of the first active regions.

BRIEF DESCRIPTION OF THE DRAWINGS

Various embodiments of the inventive concept will be described in reference with the following drawings, in which.

DETAILED DESCRIPTION OF THE EMBODIMENTS

Figure 1:
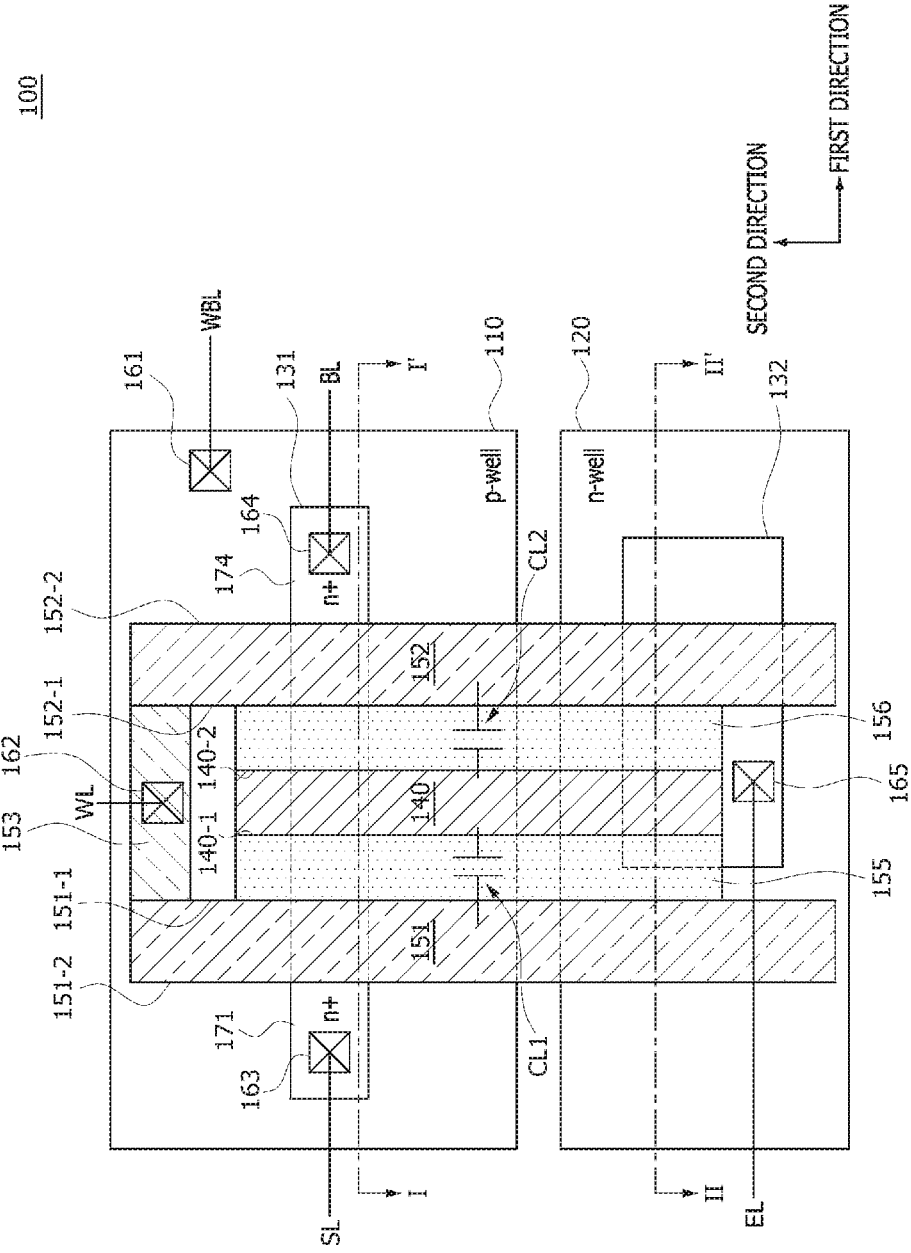
FIG. 1 is a layout diagram illustrating an example of a unit cell of a nonvolatile memory device in accordance with an embodiment of the present disclosure.

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly or may form a connection relationship or coupling relationship by replacing the other element therebetween.

Various embodiments are directed to nonvolatile memory devices having a lateral coupling structure and a single-layer gate.

A nonvolatile memory device having a stack gate structure may provide a vertical coupling structure that induces a coupling voltage to a floating gate of the stack gate structure when a gate voltage is applied to a control gate of the stack gate structure. However, in case of a nonvolatile memory device having a single-layer gate, a gate voltage has to be applied to a junction region formed in a substrate to induce a coupling voltage to a floating gate because no control gate is provided in the nonvolatile memory device. In such a case, since the nonvolatile memory device having a single-layer gate generally has a relatively low cell coupling ratio as compared with the nonvolatile memory device having a stack gate structure, it may be necessary to increase the gate voltage of the nonvolatile memory device having a single-layer gate to obtain the same performance as the nonvolatile memory device having a stack gate structure. As a result, the power consumption of the nonvolatile memory device having a single-layer gate may be higher than the power consumption of the nonvolatile memory device having a stack gate structure. Accordingly, the following embodiments may provide nonvolatile memory devices having a lateral coupling structure exhibiting a cell coupling ratio higher than a cell coupling ratio of a vertical coupling structure of the stack gate structure in order to improve cell performance without increasing their power consumption. In addition, the nonvolatile memory devices in accordance with the following embodiments may have a cell layout diagram enough to separate a junction region coupled to a bit line in a selected cell from a floating gate of another cell neighboring with the selected cell in order to suppress a program disturbance phenomenon that a voltage applied to a bit line of the selected cell affects the other cell which is not selected but adjacent to the selected cell. The nonvolatile memory devices in accordance with the various embodiments will be described in detail hereinafter with reference to the accompanying drawings.

Figure 2:
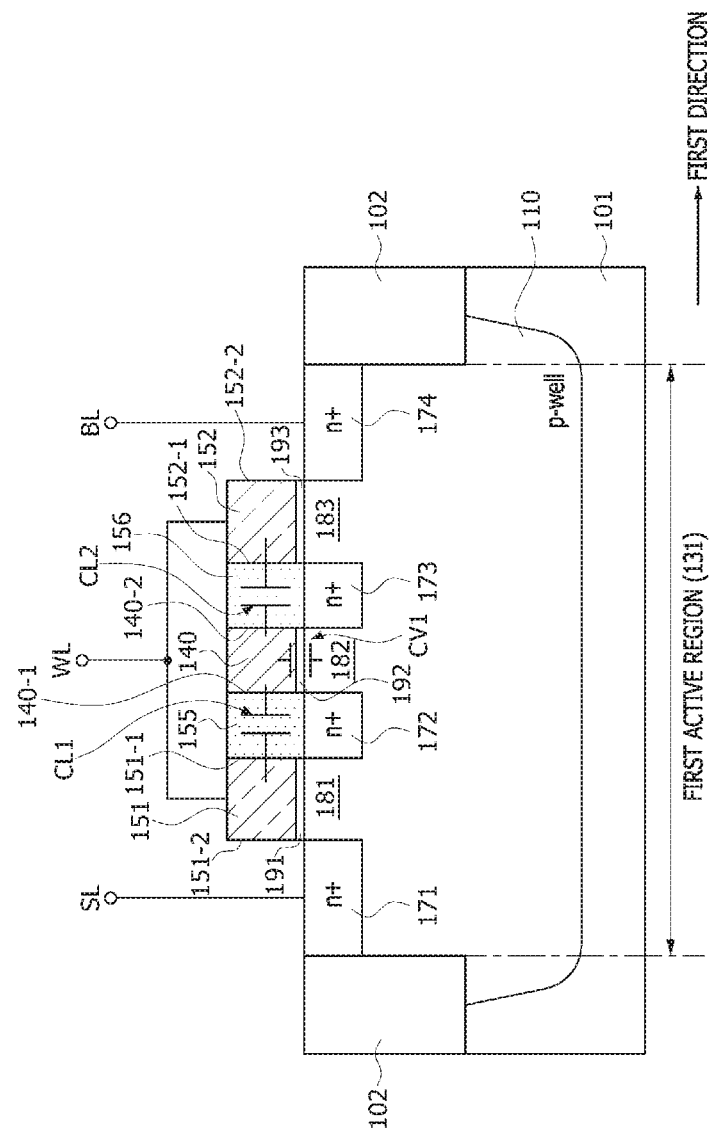
FIG. 2 is a cross-sectional view taken along a line I-I' of FIG. 1.
Figure 3:
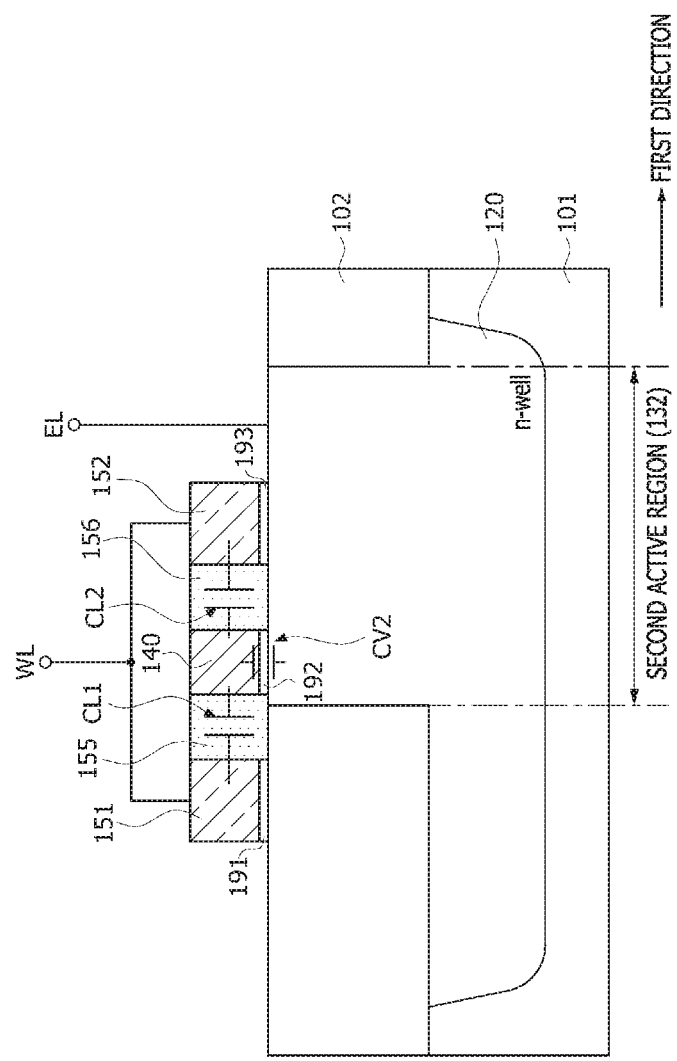
FIG. 3 is a cross-sectional view taken along a line II-II' of FIG. 1.

FIG. 1 is a layout diagram illustrating an example of a unit cell 100 of a nonvolatile memory device in accordance with an embodiment of the present disclosure. FIG. 2 is a cross-sectional view taken along a line I-I' of FIG. 1, and FIG. 3 is a cross-sectional view taken along a line II-II' of FIG. 1. In FIGS. 1, 2 and 3, the same reference numerals denote the same elements. Referring to FIG. 1, the unit cell 100 of the nonvolatile memory device in accordance with an embodiment may include a first well region 110 and a second well region 120 disposed in a substrate (101 of FIGS. 2 and 3). The first well region 110 may have a conductivity type opposite to a conductivity type of the second well region 120. For example, the first well region 110 may be a P-type well (also referred to as a p-well), and the second well region 120 may be an N-type well (also referred to as an n-well). The first well region 110 may be coupled to a well bias line WBL through a well contact 161. A first active region 131 may be disposed in the first well region 110. The first active region 131 may be defined by an isolation layer (102 of FIGS. 2 and 3). The first active region 131 may extend in a first direction (corresponding to a lateral direction in FIG. 1).

A floating gate 140 may extend in a second direction (corresponding to a vertical direction in FIG. 1) to intersect the first active region 131. The floating gate 140 may have a first side surface 140-1 and a second side surface 140-2 facing each other. A first selection gate 151 may extend in the second direction to be parallel with the floating gate 140 and may be located to intersect the first active region 131 adjacent to the first side surface 140-1 of the floating gate 140. The first selection gate 151 may have a first side surface 151-1 and a second side surface 151-2 facing each other. The first side surface 151-1 of the first selection gate 151 may face the first side surface 140-1 of the floating gate 140. A second selection gate 152 may extend in the second direction to be parallel with the floating gate 140 and may be located to intersect the first active region 131 adjacent to the second side surface 140-2 of the floating gate 140. The second selection gate 152 may have a first side surface 152-1 and a second side surface 152-2 facing each other. The first side surface 152-1 of the second selection gate 152 may face the second side surface 140-2 of the floating gate 140. As a result, the floating gate 140 may be disposed between the first and second selection gates 151 and 152. The floating gate 140 may be spaced apart from each of the first and second selection gates 151 and 152.

A first dielectric layer 155 may be disposed between the first side surface 140-1 of the floating gate 140 and the first side surface 151-1 of the first selection gate 151. The floating gate 140, the first dielectric layer 155 and the first selection gate 151 may overlap with each other along the first direction. The floating gate 140, the first dielectric layer 155 and the first selection gate 151 may provide a first lateral coupling capacitive component CL1. A second dielectric layer 156 may be disposed between the second side surface 140-2 of the floating gate 140 and the first side surface 152-1 of the second selection gate 152. The floating gate 140, the second dielectric layer 156 and the second selection gate 152 may overlap with each other along the first direction. The floating gate 140, the second dielectric layer 156 and the second selection gate 152 may provide a second lateral coupling capacitive component CL2.

The first and second selection gates 151 and 152 may be electrically connected to each other by a conductive connection line 153. The conductive connection line 153 may extend in the first direction. A first end portion of the conductive connection line 153 may be in direct contact with the first side surface 151-1 of an end portion of the first selection line 151. A second end portion of the conductive connection line 153 may be in direct contact with the first side surface 152-1 of an end portion of the second selection gate 152. In an embodiment, the conductive connection line 153 may not overlap with the first active region 131 in a plan view and may be disposed on the isolation layer 102 surrounding the first active region 131. A word line contact 162 may be disposed on the conductive connection line 153 for coupling the conductive connection line 153 to a word line WL. In operation when a bias voltage is applied to the word line WL, the bias voltage may be applied to both of the first and second selection gates 151 and 152 through the conductive connection line 153.

Referring to FIGS. 1 and 2, a plurality of junction regions and a plurality of channel regions may be disposed in the first active region 131. The first active region 131 may be defined in an upper portion of the first well region 110 disposed in the substrate 101 by the isolation layer 102. A first junction region 171, a first channel region 181, a second junction region 172, a second channel region 182, a third junction region 173, a third channel region 183 and a fourth junction region 174 may be sequentially and continuously arrayed in the first active region 131 in the first direction. Accordingly, the first junction region 171 and the second junction region 172 may be spaced apart from each other by the first channel region 181. The second junction region 172 and the third junction region 173 may be spaced apart from each other by the second channel region 182. The third junction region 173 and the fourth junction region 174 may be spaced apart from each other by the third channel region 183. In an embodiment, a side surface of the first junction region 171 and a side surface of the fourth junction region 174 may be in contact with a side surface of the isolation layer 102.

All of the first, second, third and fourth junction regions 171, 172, 173 and 174 may have a conductivity type which is opposite to a conductivity type of the first well region 110. For example, if the first well region 110 is a P-type well region, all of the first, second, third and fourth junction regions 171, 172, 173 and 174 may be N-type junction regions. As illustrated in FIG. 2, the first channel region 181 may vertically overlap with the first selection gate 151. A first gate insulation layer 191 may be disposed between the first channel region 181 and the first selection gate 151. The second channel region 182 may vertically overlap with the floating gate 140. A second gate insulation layer 192 may be disposed between the second channel region 182 and the floating gate 140. The third channel region 183 may vertically overlap with the second selection gate 152. A third gate insulation layer 193 may be disposed between the third channel region 183 and the second selection gate 152.

The first junction region 171 may be disposed in the first active region 131 between the isolation layer 102 and the first channel region 181. The first junction region 171 may be coupled to a source line SL through a source line contact 163. The second junction region 172 may be disposed in the first active region 131 between the first channel region 181 and the second channel region 182. No bias voltage may be directly applied to the second junction region 172. The third junction region 173 may be disposed in the first active region 131 between the second channel region 182 and the third channel region 183. No bias voltage may be directly applied to the third junction region 173. The fourth junction 174 may be disposed in the first active region 131 between the third channel region 183 and the isolation layer 102. The fourth junction 174 may be coupled to a bit line BL through a bit line contact 164.

As described with reference to FIG. 1, the floating gate 140, the first dielectric layer 155 and the first selection gate 151 may provide the first lateral coupling capacitive component CL1. A first capacitance value C1 of the first lateral coupling capacitive component CL1 may be determined by a thickness of the first dielectric layer 155 in the first direction, a cross-sectional area of the first dielectric layer 155 taken along a line parallel with the second direction, and a dielectric constant of the first dielectric layer 155. In addition, the floating gate 140, the second dielectric layer 156 and the second selection gate 152 may provide the second lateral coupling capacitive component CL2. A second capacitance value C2 of the second lateral coupling capacitive component CL2 may be determined by a thickness of the second dielectric layer 156 in the first direction, a vertical cross-sectional area of the second dielectric layer 156 taken along a line parallel with the second direction, and a dielectric constant of the second dielectric layer 156. In an embodiment, the first capacitance value C1 may be substantially equal to the second capacitance value C2. For example, the thickness of the first dielectric layer 155 in the first direction and a width of the first dielectric layer 155 in the second direction may be substantially equal to the thickness of the second dielectric layer 156 in the first direction and a width of the second dielectric layer 156 in the second direction, respectively. The floating gate 140, the second gate insulation layer 192 and the first active region 131 (i.e., the first well region 110) may provide a first vertical capacitive component CV1. A third capacitance value C3 corresponding to a capacitance value of the first vertical capacitive component CV1 may be determined by a vertical thickness of the second gate insulation layer 192, a horizontal cross-sectional area of the second gate insulation layer 192 overlapping with the first active region 131, and a dielectric constant of the second gate insulation layer 192.

Referring to FIGS. 1 and 3, a second active region 132 may be disposed in the second well region 120. The second well region 120 may surround the second active region 132 in the substrate 101. The second active region 132 may be defined by the isolation layer 102. The second active region 132 may be disposed not to overlap with the first selection gate 151 in a plan view. In contrast, the second active region 132 may be disposed to overlap with a portion of the second selection gate 152 in a plan view. A top surface of the second well region 120 in the second active region 132 may be in contact with the second gate insulation layer 192 and the third gate insulation layer 193. The second well region 120 may be coupled to an erasure line EL through an erasure line contact 165. Although not illustrated in the drawings, a heavily doped contact region may be disposed in the second well region 120 for reducing a contact resistance value between the erasure line contact 165 and the second well region 120. The floating gate 140, the second gate insulation layer 192 and the second active region 132 (i.e., the second well region 120) may provide a second vertical capacitive component CV2. A fourth capacitance value C4 corresponding to a capacitance value of the second vertical capacitive component CV2 may be determined by a vertical thickness of the second gate insulation layer 192, a horizontal cross-sectional area of the second gate insulation layer 192 overlapping with the second active region 132, and a dielectric constant of the second gate insulation layer 192.

In the unit cell 100 of the nonvolatile memory device in accordance with an embodiment, a program operation may be performed using a hot electron injection mechanism, and erasure operation may be performed using a Fowler-Nordheim (F-N) tunneling mechanism. During a program operation, a hot electron injection phenomenon may occur in the first active region 131 with hot electrons being injected into the floating gate 140. In contrast, during an erasure operation, electrons are ejected from the floating gate 140 in the second active region 132 according to the F-N tunneling mechanism. During a program operation, a coupling voltage may be induced at the floating gate 140. The coupling voltage may be induced by a word line voltage applied to the first and second selection gate 151 and 152. A coupling voltage Vfg induced at the floating gate 140 may be expressed by the following equation 1.

$$Vfg = \frac{(C1 \times Vwl + C2 \times Vwl + C3 \times Vpw + C4 \times Vnw)}{(C1 + C2 + C3 + C4)} \quad \text{(Equation 1)}$$

In the equation 1, "C1", "C2", "C3" and "C4" denote capacitance values of the first lateral coupling capacitive component CL1, the second lateral coupling capacitive component CL2, the first vertical capacitive component CV1, and a second vertical capacitive component CV2, respectively. In addition, "Vwl" denotes a word line voltage applied to both of the first and second section gates 151 and 152, "Vpw" denotes a voltage applied to the first well region 110, and "Vnw" denotes a voltage applied to the second well region 120. As can be seen from the equation 1, if the word line voltage "Vwl" is applied to both of the first and second selection gate 151 and 152, the coupling voltage Vfg induced at the floating gate 140 may become higher as compared with a case that the word line voltage "Vwl" is applied to only any one of the first and second selection gate 151 and 152. A program operation, an erasure operation and a read operation of the unit cell 100, in accordance with embodiments of the present invention will be described in detail hereinafter with reference to FIGS. 4 to 9.

Figure 4:
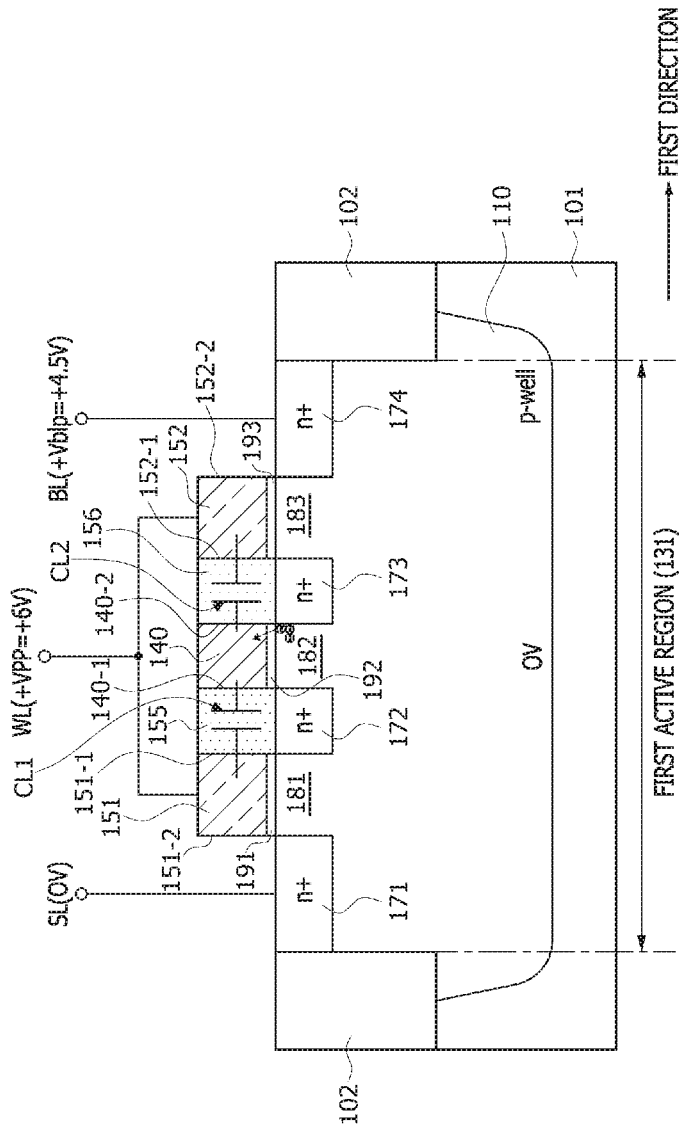
FIGS. 4 and 5 are cross-sectional views illustrating a program operation of a nonvolatile memory device in accordance with an embodiment of the present disclosure.
Figure 5:
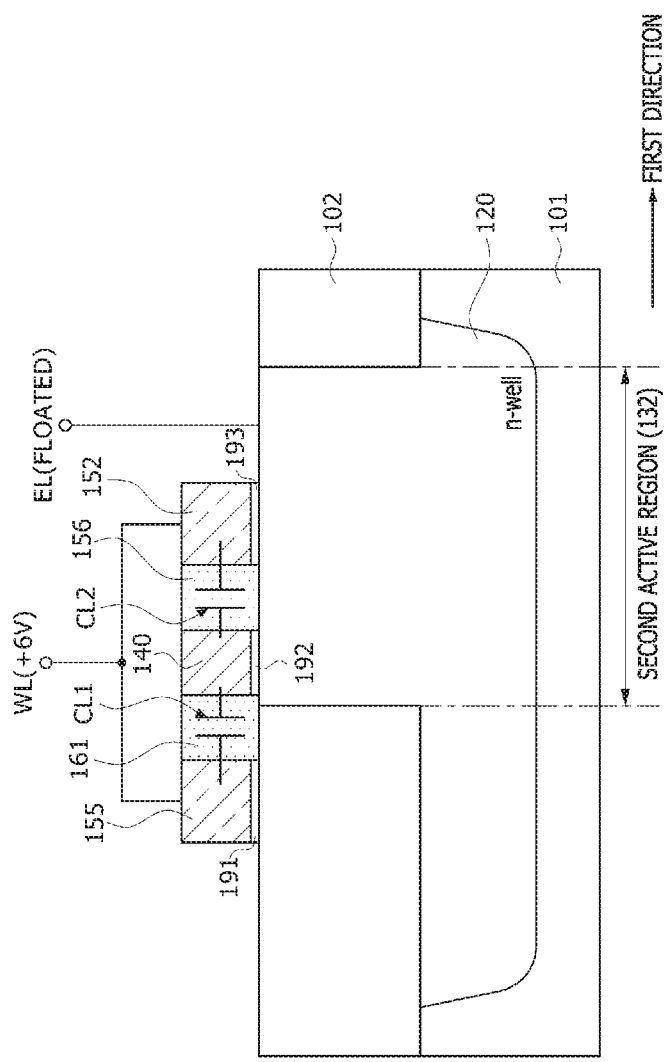

FIGS. 4 and 5 are cross-sectional views illustrating a program operation of the unit cell 100 in accordance with an embodiment of the present disclosure. The cross-sectional view illustrated in FIG. 4 is substantially the same as a cross-sectional view taken along a line I-I' of FIG. 1, and the cross-sectional view illustrated in FIG. 5 is substantially the same as a cross-sectional view taken along a line II-II' of FIG. 1. Referring to FIGS. 4 and 5, a positive program voltage +Vpp, for example, +6 volts may be applied to the word line WL to program the unit cell 100. The source line SL may be grounded, and a positive bit line program voltage +Vblp, for example, +4.5 volts may be applied to the bit line BL. The positive bit line program voltage +Vblp may be lower than the positive program voltage +Vpp. In addition, the well bias line WBL may also be grounded. A ground voltage may be applied to the first well region 110 through the well bias line WBL, and the erasure line EL may be floated. Thus, the second well region 120 may be floated.

The positive program voltage +Vpp may be applied to both the first and second selection gates 151 and 152 through the word line WL, the word line contact 162, and the conductive connection line 153. Thus, an N-type inversion channel may be formed in the first and third channel regions 181 and 183. As the N-type inversion channel is formed in the first channel region 181, the second junction region 172 may have substantially the same electric potential as the ground voltage applied to the first junction region 171 through the source line SL. In addition, As the N-type inversion channel is formed in the third channel region 183, the third junction region 173 may have substantially the same electric potential as the positive bit line program voltage +Vblp applied to the fourth junction region 174 through the bit line BL. In such a case, as the coupling voltage Vfg expressed by the equation 1 is induced at the floating gate 140 and the ground voltage and the positive bit line program voltage +Vblp are respectively applied to the second and third junction regions 172 and 173, hot electrons may be generated in the vicinity of the third junction region 173 by a lateral electric field created between the second and third junction regions 172 and 173. The hot electrons generated in the vicinity of the third junction region 173 may be injected into the floating gate 140 through the second gate insulation layer 192 by a vertical electric field created between the floating gate 140 and the second channel region 182. As a result, since a threshold voltage of the unit cell 100 may positively increase, the unit cell 100 may be programmed.

Figure 6:
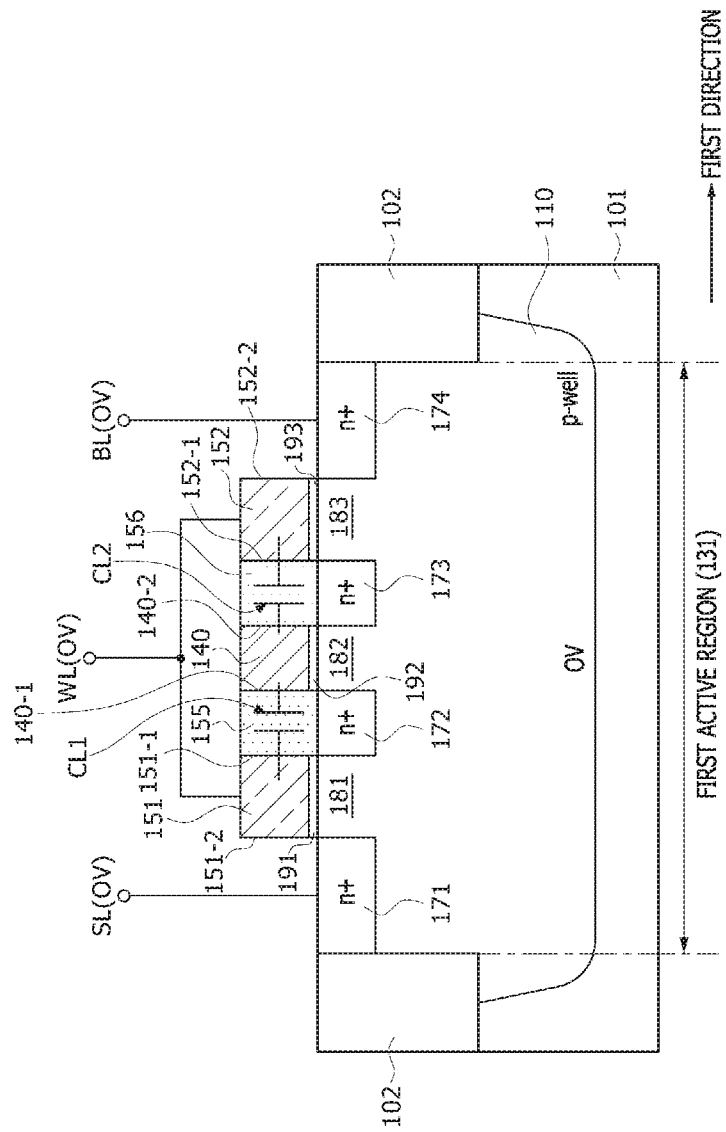
FIGS. 6 and 7 are cross-sectional views illustrating an erasure operation of a nonvolatile memory device in accordance with an embodiment of the present disclosure.
Figure 7:
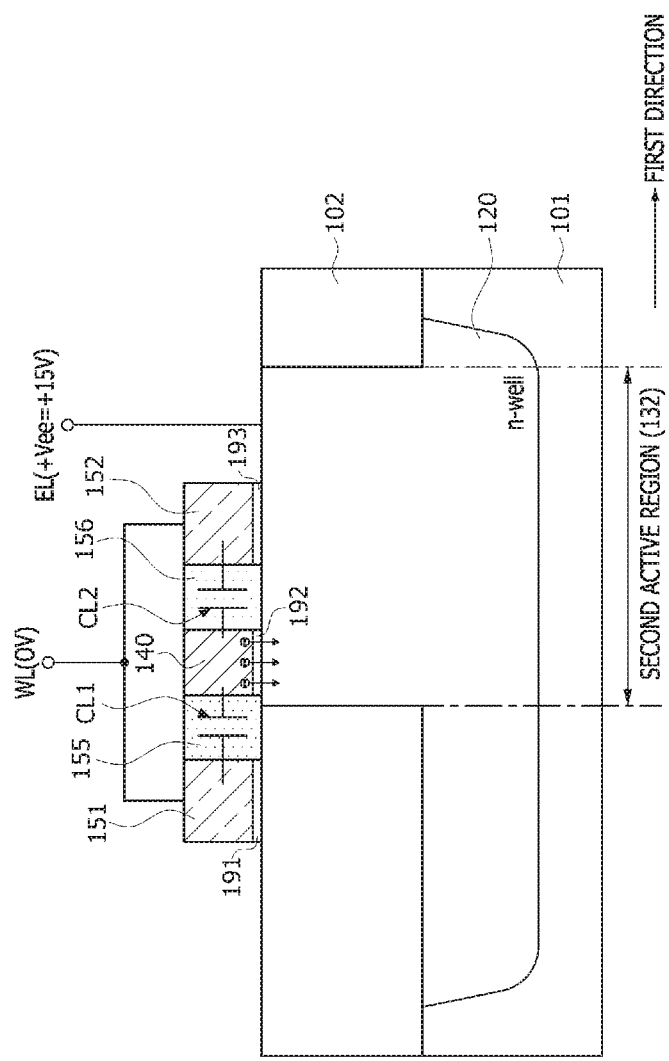

FIGS. 6 and 7 are cross-sectional views illustrating an erasure operation of the unit cell 100, in accordance with an embodiment of the present disclosure. The cross-sectional view illustrated in FIG. 6 is substantially the same as a cross-sectional view taken along a line I-I' of FIG. 1, and the cross-sectional view illustrated in FIG. 7 is substantially the same as a cross-sectional view taken along a line II-II' of FIG. 1. Referring to FIGS. 6 and 7, a positive erasure voltage +Vee, for example, +15 volts may be applied to the erasure line EL for erasing the unit cell 100. The word line WL, the source line SL and the bit line BL may be grounded. In addition, the well bias line WBL may also be grounded. Thus, a ground voltage may be applied to the first well region 110 through the well bias line WBL. The second well region 120 may have substantially the same electric potential as the positive erasure voltage +Vee applied to the erasure line EL.

Since the word line WL is grounded and the first well region 110 has an electric potential of a ground voltage, no channel is formed in any of the first, second and third channel regions 181, 182 and 183 defined in the first active region 131 and a voltage difference between the floating gate 140 and the first active region 131 may be substantially zero to be negligible. In contrast, a vertical electric field corresponding to the positive erasure voltage +Vee may be created across the second gate insulation layer 192 between the floating gate 140 and the second active region 132. Thus, electrons in the floating gate 140 may be injected into the second active region 132 through the second gate insulation layer 192 by the vertical electric field. As the electrons from the floating gate 140 are injected into the second active region 132, a threshold voltage of the unit cell 100 is lowered and the unit cell 100 is erased.

Figure 8:
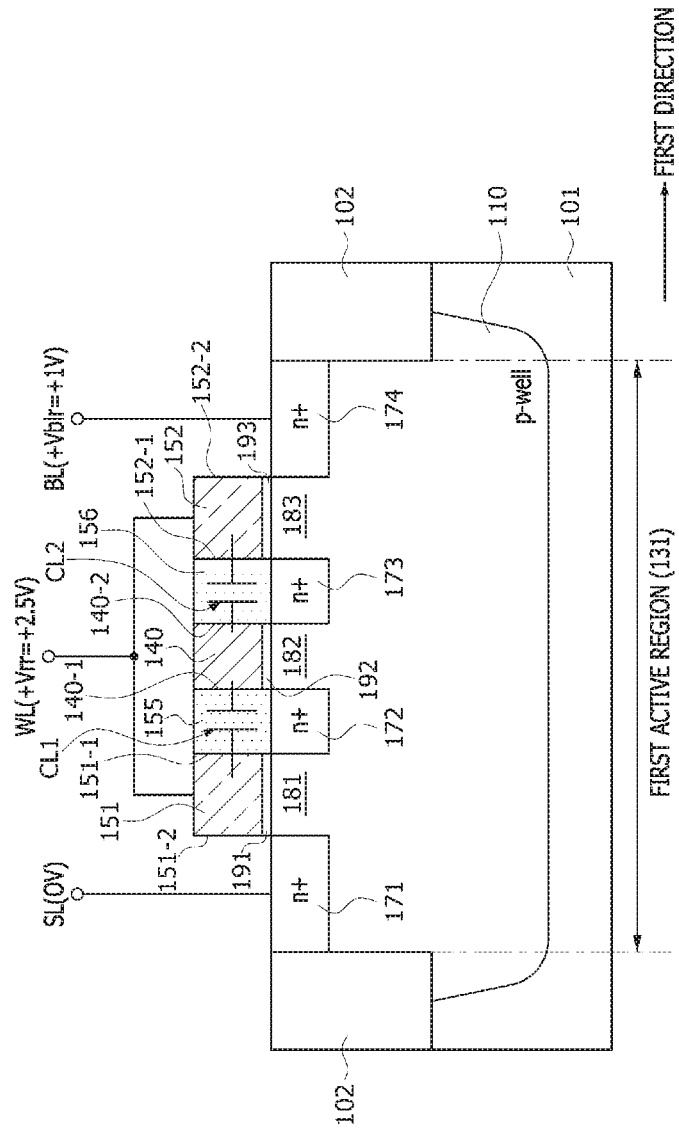
FIGS. 8 and 9 are cross-sectional views illustrating a read operation of a nonvolatile memory device in accordance with an embodiment of the present disclosure.
Figure 9:
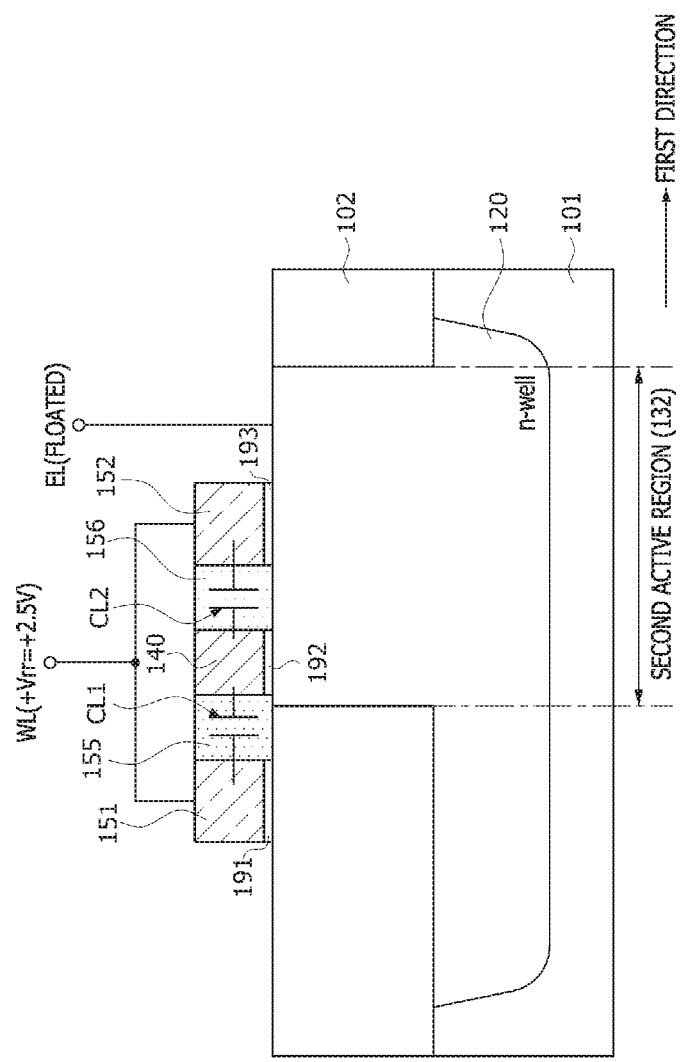

FIGS. 8 and 9 are cross-sectional views illustrating a read operation of the unit cell 100 in accordance with an embodiment of the present disclosure. The cross-sectional view illustrated in FIG. 8 is substantially the same as a cross-sectional view taken along a line I-I' of FIG. 1, and the cross-sectional view illustrated in FIG. 9 is substantially the same as a cross-sectional view taken along a line II-II' of FIG. 1. Referring to FIGS. 8 and 9, a positive read voltage +Vrr, for example, +2.5 volts may be applied to the word line WL for reading a datum stored in the unit cell 100. The positive read voltage +Vrr may be set to a voltage level which is capable of forming an inversion channel in at least the first and third channel regions 181 and 183. The source line SL may be grounded, and a positive bit line read voltage +Vblr, for example, +1 volts may be applied to the bit line BL. The positive bit line read voltage +Vblr may be lower than the positive read voltage +Vrr. In addition, the well bias line WBL may be grounded for reading a datum stored in the unit cell 100. The first well region 110 may also be grounded through the well bias line WBL. The erasure line EL may be floated. Accordingly, the second well region 120 may also be floated.

The positive read voltage +Vrr may be applied to both of the first and second selection gates 151 and 152 through the word line WL, the word line contact 162, and the conductive connection line 153. Thus, an N-type inversion channel may be formed in both of the first and third channel regions 181 and 183. As the N-type inversion channel is formed in the first channel region 181, the second junction region 172 may have substantially the same electric potential as the ground voltage applied to the first junction region 171 through the source line SL. In addition, As the N-type inversion channel is formed in the third channel region 183, the third junction region 173 may have substantially the same electric potential as the positive bit line read voltage +Vblr applied to the fourth junction region 174 through the bit line BL.

The coupling voltage Vfg expressed by the equation 1 may be induced at the floating gate 140, and whether an inversion channel is formed in the second channel region 182 may be determined according to whether the unit cell 100 has a programmed state or an erased state. For example, if the unit cell 100 has a programmed state (i.e., a relatively high threshold voltage), no inversion channel may be formed in the second channel region 182 and no current may flow through the bit line BL and the source line SL. Alternatively, if the unit cell 100 has an erased state (i.e., a relatively low threshold voltage), an N-type inversion channel may be formed in the second channel region 182 and a cell current may flow through the bit line BL and the source line SL. Accordingly, whether the unit cell 100 has a programmed state or an erased state may be determined by sensing the cell current flowing through the bit line BL during the read operation.

Figure 10:
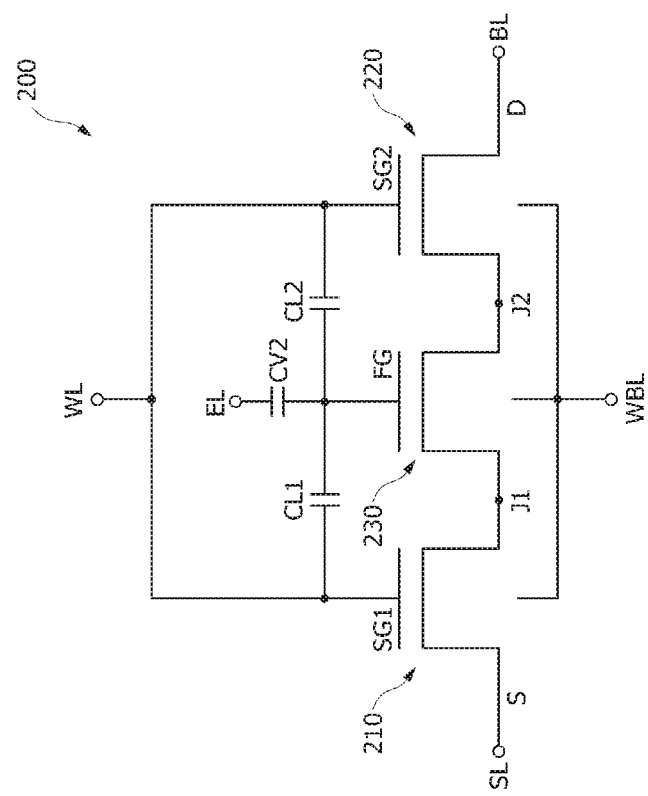
FIG. 10 is an equivalent circuit diagram illustrating a unit cell of a nonvolatile memory device in accordance with an embodiment of the present disclosure.

FIG. 10 is an equivalent circuit diagram 200 illustrating a unit cell of a nonvolatile memory device, in accordance with an embodiment of the present disclosure. The equivalent circuit diagram 200 illustrated in FIG. 10 corresponds to the unit cell 100 described with reference to FIGS. 1, 2 and 3. Referring to FIG. 10, the equivalent circuit diagram 200 may include a first selection transistor 210 having a first selection gate terminal SG1, a second selection transistor 220 having a second selection gate terminal SG2, and a storage transistor 230 having a floating gate terminal FG. The first selection gate terminal SG1 and the second selection gate terminal SG2 may be coupled to a word line WL in common. The floating gate terminal FG may be coupled to one terminal of the second vertical capacitor component (CV2 of FIG. 3), one terminal of the first lateral coupling capacitive component (CL1 of FIGS. 1, 2 and 3), and one terminal of the second lateral coupling capacitive component (CL2 of FIGS. 1, 2 and 3). The other terminal of the second vertical capacitor component CV2 may be coupled to the erasure line EL. The other terminal of the first lateral coupling capacitive component CL1 may be coupled to the first selection gate terminal SG1. The other terminal of the second lateral coupling capacitive component CL2 may be coupled to the second selection gate terminal SG2.

A source terminal S of the first selection transistor 210 may be coupled to the source line SL. A drain terminal D of the second selection transistor 220 may be coupled to the bit line BL. A drain terminal of the first selection transistor 210 and a source terminal of the storage transistor 230 may be coupled to a first junction terminal J1 corresponding to the second junction region 172 of FIG. 2. The first junction terminal 31 may act as a drain junction region of the first selection transistor 210 and as a source junction region of the storage transistor 230. A source terminal of the second selection transistor 220 and a drain terminal of the storage transistor 230 may be coupled to a second junction terminal 32 corresponding to the third junction region 173 of FIG. 2. The second junction terminal 32 may act as a source junction region of the second selection transistor 220 and as a drain junction region of the storage transistor 230. A bulk region that the first selection transistor 210, the second selection transistor 220 and the storage transistor 230 share with one another may be coupled to the well bias line (WBL of FIG. 1).

A program operation, an erasure operation and a read operation of a unit cell having the equivalent circuit diagram 200 may be performed using the same methods as described with reference to FIGS. 4 to 9. Thus, for programming the unit cell having the equivalent circuit diagram 200 a positive program voltage and a positive bit line program voltage are respectively applied to the word line WL and the bit line BL, the source line SL and the well bias line WBL are grounded, and the erasure line EL is floated. Under the above bias conditions, hot electrons are generated in the bulk region of the storage transistor 230 and are injected into the floating gate terminal FG of the storage transistor 230. As a result, a threshold voltage of the unit cell using the word line WL as a gate electrode becomes higher and the unit cell is programmed.

For performing an erasure operation, a positive erasure voltage is applied to the erasure line EL while all of the word line WL, the source line SL, the bit line BL and the well bias line WBL are grounded. Under the above bias conditions, the electrons stored in the floating gate terminal FG of the storage transistor 230 are injected into the bulk region of the storage transistor 230 through the second vertical capacitor component CV2 and move out of the unit cell through the erasure line EL. As a result, a threshold voltage of the unit cell using the word line WL as a gate electrode is lowered and the unit cell is erased.

For performing a read operation, a positive read voltage and a positive bit line read voltage are applied to the word line WL and the bit line BL, respectively, the source line SL and the well bias line WBL are grounded, and the erasure line EL is floated. Under the above bias conditions, if the unit cell has a programmed state to have a relatively high threshold voltage, no current may flow through the bit line BL. Alternatively, if the unit cell has an erased state to have a relatively low threshold voltage, a cell current may flow through the bit line BL.

Figure 11:
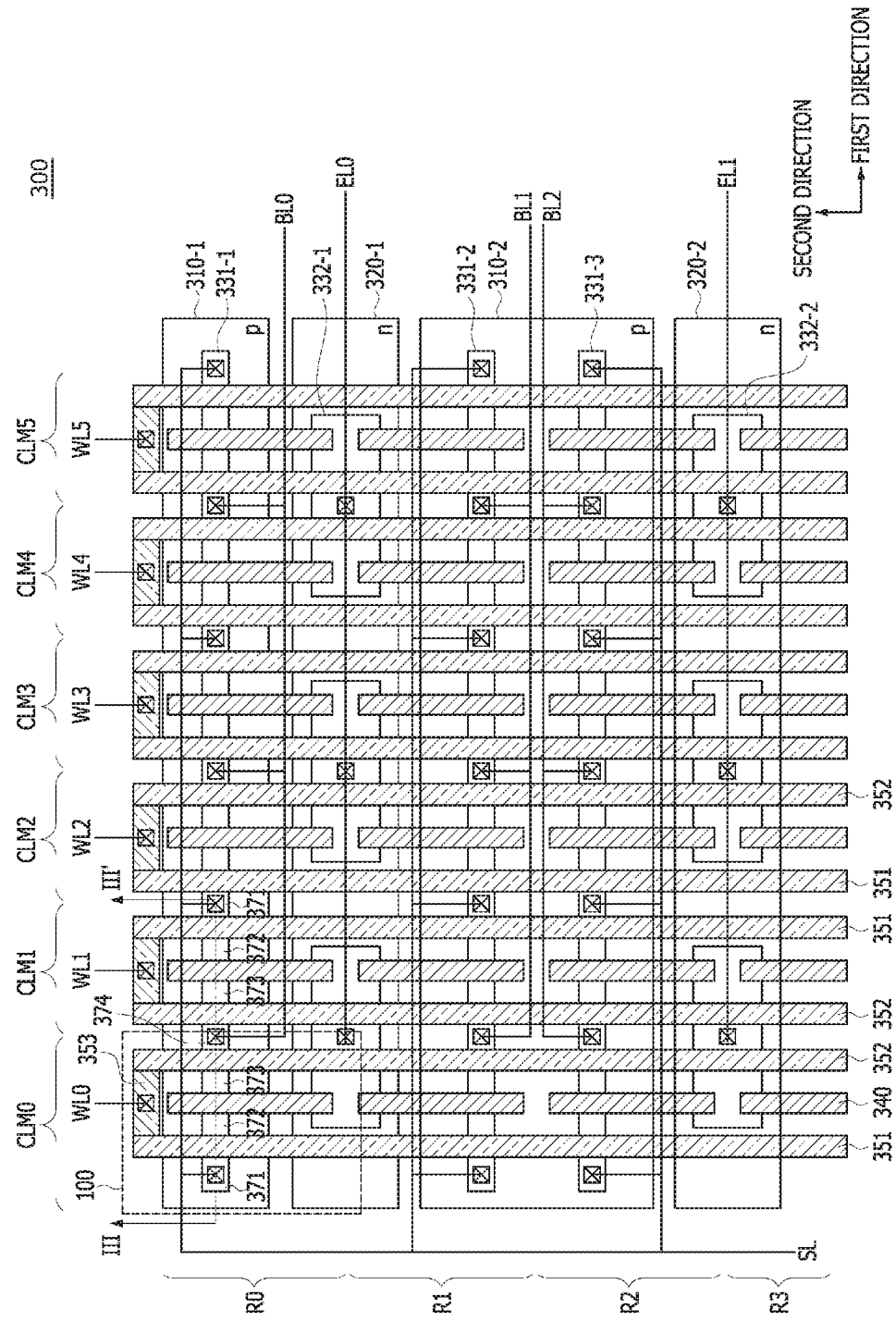
FIG. 11 is a layout diagram illustrating an example of a cell array of a nonvolatile memory device in accordance with an embodiment of the present disclosure.

FIG. 11 is a layout diagram illustrating an example of a cell array 300 in which the unit cell 100 of FIG. 1 is repeatedly arrayed. The cell array 300 may include the plurality of unit cells 100 that are arrayed in a matrix form. Thus, the plurality of unit cells 100 may be located at cross points of a plurality of rows and a plurality of columns, respectively. The indication of the first dielectric layer 155 (disposed between the first selection gate 151 and the floating gate 140 of FIG. 1) as well as the second dielectric layer 156 (disposed between the second selection gate 152 and the floating gate 140 of FIG. 1) is merely omitted in the cell array 300 of FIG. 11. The cell array 300 illustrates the first and second lateral coupling capacitive components CL1 and CL2 described with reference to FIG. 1. Referring to FIG. 11, the cell array 300 may include first well regions 310-1 and 310-2 and second well regions 320-1 and 320-2 which are alternately arrayed to be spaced apart from each other in the second direction. The first well region 310-1 (corresponding to a first one of the first well regions 310-1 and 310-2) may be shared by the unit cells 100 arrayed in a first row R0. The second well region 320-1 (corresponding to a first one of the second well regions 320-1 and 320-2) may be shared by the unit cells 100 arrayed in the first row R0 and the unit cells 100 arrayed in a second row R1. The first well region 310-2 (corresponding to a second one of the first well regions 310-1 and 310-2) may be shared by the unit cells 100 arrayed in the second row R1 and a third row R2. The second well region 320-2 (corresponding to a second one of the second well regions 320-1 and 320-2) may be shared by the unit cells 100 arrayed in the third row R2 and a fourth row R3. In an embodiment, the first well regions 310-1 and 310-2 may be P-type well regions, and the second well regions 320-1 and 320-2 may be N-type well regions.

A first active region 331-1 (corresponding to a first one of first active regions 331-1, 331-2 and 331-3) may be disposed in the first well region 310-1. A first active region 331-2 (corresponding to a second one of the first active regions 331-1, 331-2 and 331-3) and a first active region 331-3 (corresponding to a third one of the first active regions 331-1, 331-2 and 331-3) may be disposed in the first well region 310-2 to be spaced apart from each other in the second direction. Each of the first active regions 331-1, 331-2 and 331-3 may have a stripe shape extending in the first direction. The first active regions 331-1, 331-2 and 331-3 may be respectively disposed in the rows R0, R1 and R2 such that each of the first active regions 331-1, 331-2 and 331-3 is shared by the unit cells arrayed in any one of the first to third rows R0, R1 and R2. For example, the first active regions 331-1 may be shared by the unit cells arrayed in the first row R0, the first active regions 331-2 may be shared by the unit cells arrayed in the second row R1, and the first active regions 331-3 may be shared by the unit cells arrayed in the third row R2.

A first group of second active regions 332-1 may be disposed in the second well region 320-1 to be spaced apart from each other in the first direction. A second group of second active regions 332-2 may be disposed in the second well region 320-2 to be spaced apart from each other in the first direction. All the first group of second active regions 332-1 may be coupled to a first erasure line EL0. All the second group of second active regions 332-2 may be coupled to a second erasure line EL1. An $n^{th}$ group of second active regions 332-$n$ may be shared by the unit cells arrayed in a $(2(n-1)+1)^{th}$ row and the unit cells arrayed in a $(2(n-1)+2)^{th}$ row (where, "n" denotes a natural number). Thus, if "n" is one, the first group of second active regions 332-1 may be shared by the unit cells in the first row R0 and the unit cells in the second row R1. In addition, if "n" is two, the second group of second active regions 332-2 may be shared by the unit cells in the third row R2 and the unit cells in the fourth row R3. An $m^{th}$ one in the first direction among the $n^{th}$ group of second active regions 332-$n$ may be shared by the unit cell located at a cross point of a $(2(n-1)+1)^{th}$ row and a $(2(m-1)+1)^{th}$ column, the unit cell located at a cross point of a $(2(n-1)+2)^{th}$ row and a $(2(m-1)+1)^{th}$ column, the unit cell located at a cross point of a $(2(n-1)+1)^{th}$ row and a $(2(m-1)+2)^{th}$ column, and the unit cell located at a cross point of a $(2(n-1)+2)^{th}$ row and a $(2(m-1)+2)^{th}$ column (where, "m" denotes a natural number). Accordingly, if "n" is one and "m" is one, a leftmost one among the first group of second active regions 332-1 may be shared by the unit cell located at a cross point of the first row R0 and the first column CLM0, the unit cell located at a cross point of the second row R1 and the first column CLM0, the unit cell located at a cross point of the first row R0 and the second column CLM1, and the unit cell located at a cross point of the second row R1 and the second column CLM1. Alternatively, if "n" is one and "m" is two, a second leftmost one (i.e., a middle one in FIG. 11) among the first group of second active regions 332-1 may be shared by the unit cell located at a cross point of the first row R0 and the third column CLM2, the unit cell located at a cross point of the second row R1 and the third column CLM2, the unit cell located at a cross point of the first row R0 and the fourth column CLM3, and the unit cell located at a cross point of the second row R1 and the fourth column CLM3. In addition, if "n" is one and "m" is three, a third leftmost one (i.e., a rightmost one in FIG. 11) among the first group of second active regions 332-1 may be shared by the unit cell located at a cross point of the first row R0 and the fifth column CLM4, the unit cell located at a cross point of the second row R1 and the fifth column CLM4, the unit cell located at a cross point of the first row R0 and the sixth column CLM5, and the unit cell located at a cross point of the second row R1 and the sixth column CLM5. Moreover, if "n" is two, each of the second group of second active regions 332-2 may be shared by the unit cells in the same manner as described above in conjunction with a case that "n" is one.

Floating gates 340 corresponding to the floating gate 140 illustrated in FIG. 1 may be disposed to be spaced apart from each other in the first direction and the second direction. Each of the floating gates 340 may be allocated in any one of the unit cells. Specifically, the floating gates 340 arrayed in a predetermined row to be spaced apart from each other in the first direction may be allocated in the unit cells arrayed in the predetermined row, respectively. For example, a leftmost one of the floating gates 340 arrayed in the first row R0 may be allocated in the unit cell located at a cross point of the first row R0 and the first column CLM0. Each of the floating gates 340 may be disposed to overlap with the first well region 310-1 or 310-2 and the second well region 320-1 or 320-2 which are adjacent to each other. For example, the floating gate 340 allocated in each of the unit cells arrayed in the first row R0 may be disposed to overlap with the first well region 310-1 and the second well region 320-1 which are adjacent to each other. In addition, the floating gate 340 allocated in each of the unit cells arrayed in the second row R1 may be disposed to overlap with the first well region 310-2 and the second well region 320-1 which are adjacent to each other.

Each of the floating gates 340 may extend in the second direction to intersect any one of the first active regions 331-1, 331-2 and 331-3, which is disposed in one of the first well regions 310-1 and 310-2, in a plan view. For example, the floating gates 340 allocated in the unit cells arrayed in the first row R0 may be disposed to intersect the first one 331-1 of the first active regions 331-1, 331-2 and 331-3. In addition, the floating gates 340 allocated in the unit cells arrayed in the second row R1 may be disposed to intersect the second one 331-2 of the first active regions 331-1, 331-2 and 331-3. One end of each of the floating gates 340 may overlap with any one of the second active regions 332-1 and 332-2 in a plan view. For example, first ends of the floating gates 340 included in the unit cells 100 respectively located at four cross points of the first and second rows R0 and R1 and the first and second columns CLM0 and CLM1 may overlap with the leftmost one among the first group of second active regions 332-1. In addition, first ends of the floating gates 340 included in the unit cells 100 respectively located at four cross points of the first and second rows R0 and R1 and the third and fourth columns CLM2 and CLM3 may overlap with the second leftmost one (i.e., the middle one) among the first group of second active regions 332-1.

One of first selection gates 351 and one of second selection gates 352 may be disposed at both sides of a certain one of the floating gates 340 to be parallel with the certain floating gate 340. For example, in each of the unit cells arrayed in the odd columns CLM0, CLM2 and CLM4, the first selection gate 351 and the second selection gate 352 may be disposed at a left side and a right side of the floating gate 340, respectively. In contrast, in each of the unit cells arrayed in the even columns CLM1, CLM3 and CLM5, the first selection gate 351 and the second selection gate 352 may be disposed at a right side and a left side of the floating gate 340, respectively. Thus, if "i" is an even number, the second selection gate 352 disposed in an $i^{th}$ column may be disposed to be adjacent to the second selection gate 352 disposed in an $(i-1)^{th}$ column and to face the second selection gate 352 disposed in the $(i-1)^{th}$ column. In addition, the first selection gate 351 disposed in the $i^{th}$ column may be disposed to be adjacent to the first selection gate 351 disposed in an $(i+1)^{th}$ column and to face the first selection gate 351 disposed in the $(i+1)^{th}$ column.

The first and second selection gates 351 and 352 in each column may extend in the second direction to overlap with all the first well regions 310-1 and 310-2 and the second well regions 320-1 and 320-2 which are alternately arrayed in the second direction. Each of the first selection gates 351 may extend in the second direction to overlap with all the first active regions 331-1, 331-2 and 331-3 disposed in the first well regions 310-1 and 310-2, but not to overlap with the second active regions 332-1 and 332-2 disposed in the second well regions 320-1 and 320-2. In contrast, each of the second selection gates 352 may extend in the second direction to overlap with all the first active regions 331-1, 331-2 and 331-3 disposed in the first well regions 310-1 and 310-2, any one of the second active regions 332-1 disposed in the second well region 320-1, and any one of the second active regions 332-2 disposed in the second well region 320-2. The first selection gate 351 and the second selection gate 352 disposed in each column may be coupled to each other by a conductive connection line 353 corresponding to the conductive connection line 153 illustrated in FIG. 1. The unit cells arrayed in each column may share the first and second selection gates 351 and 352 coupled to each other by the conductive connection line 353. The conductive connection line 353 connecting the first and second selection gates 351 and 352 in the first column R0 to each other may be coupled to a first word line WL0. Similarly, the conductive connection lines 353 in the second to sixth columns CLM1~CLM5 may be coupled to second to sixth word lines WL1~WL5, respectively.

First junction regions 371 corresponding to the first junction region 171 illustrated in FIGS. 1 and 2 may be respectively disposed in both ends of the first active regions 331-1, 331-2 and 331-3, which are adjacent to the first selection gates 351 in the first and sixth columns CLM0 and CLM5. The first junction regions 371 may also be disposed in the first active regions 331-1, 331-2 and 331-3 between the pair of first selection gates 351 adjacent to each other. Thus, the first junction regions 371 may be shared by the unit cells arrayed in an $i^{th}$ column and an $(i+1)^{th}$ column (where, "i" is an even number). All the first junction regions 371 may be coupled to the source line SL. Second junction regions 372 corresponding to the second junction region 172 illustrated in FIGS. 1 and 2 may be disposed in the first active regions 331-1, 331-2 and 331-3 between the first selection gate 351 and the floating gates 340 adjacent to the first selection gate 351. Third junction regions 373 corresponding to the third junction region 173 illustrated in FIGS. 1 and 2 may be disposed in the first active regions 331-1, 331-2 and 331-3 between the second selection gate 352 and the floating gates 340 adjacent to the second selection gate 352. Fourth junction regions 374 corresponding to the fourth junction region 174 illustrated in FIGS. 1 and 2 may be respectively disposed in the first active regions 331-1, 331-2 and 331-3 between the pair of second selection gates 352 which are adjacent to each other. If "j" is an odd number, the fourth junction regions 374 may be shared by the unit cells arrayed in a $j^{th}$ column and a $(j+)^{th}$ column. The fourth junction regions 374 disposed in each of the first, second and third rows R0, R1 and R2 may be coupled to any one of first to third bit lines BL0, BL1 and BL2. The first junction regions 371 may correspond to source regions of the unit cells, and the fourth junction regions 374 may correspond to drain regions of the unit cells.

The source line SL may be coupled to all the first junction regions 371 of the unit cells arrayed in all the rows and all of the columns. In contrast, each of the bit lines BL0, BL1 and BL2 may be coupled to all the fourth junction regions 374 of the unit cells arrayed in any one of the first to third rows R0, R1 and R2. Thus, the fourth junction regions 374 disposed in the first active region 331-1 in the first row R0 may be coupled to the first bit line BL0, and the fourth junction regions 374 disposed in the first active region 331-2 in the second row R1 may be coupled to the second bit line BL1. In addition, the fourth junction regions 374 disposed in the first active region 331-3 in the third row R2 may be coupled to the third bit line BL2. If "j" is an odd number, all the unit cells arrayed in a $j^{th}$ row and a $(j+1)^{th}$ column may be coupled to any one of erasure lines EL0 and EL1. Thus, the first group of second active regions 332-1 disposed in the first and second rows R0 and R1 may be coupled to the first erasure line EL0, and the second group of second active regions 332-2 disposed in the third and fourth rows R2 and R3 may be coupled to the second erasure line EL1.

Figure 12:
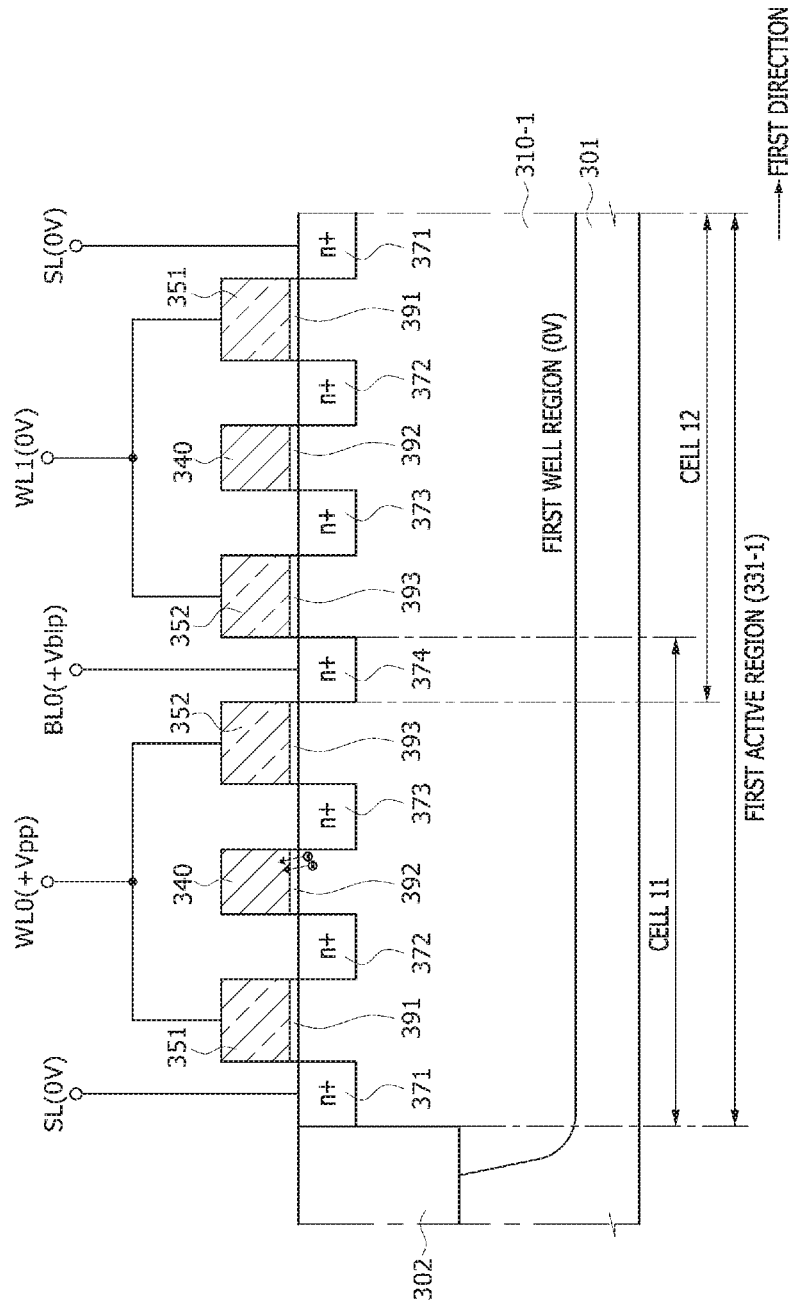
FIG. 12 is a cross-sectional view taken along a line III-III' of FIG. 11.

FIG. 12 is a cross-sectional view taken along a line III-III' of FIG. 11. In FIG. 12, the same reference numerals or the same reference characters as used in FIG. 11 denote the same elements. A program operation, an erasure operation and a read operation of the cell array 300 illustrated in FIG. 11 may be performed using substantially the same bias conditions as described with reference to FIGS. 4 to 9. In particular, according to a configuration of the cell array 300, a cell-to-cell disturbance phenomenon may be effectively suppressed due to the presence of the second selection gate 352 while the positive bit line program voltage +Vblp is applied to any one selected from the bit lines to perform the program operation. Referring to FIG. 12, the first well region 310-1 may be disposed in an upper portion of a substrate 301 to extend in the first direction. The first active region 331-1 defined by an isolation layer 302 may be disposed in an upper portion of the first well region 310-1.

A unit cell 11 located at a cross point of the first row R0 and the first column CLM0 and a unit cell 12 located at a cross point of the first row R0 and the second column CLM1 may be continuously disposed along the first direction. Each of the unit cell 11 and the unit cell 12 may be configured to have the floating gate 340, the first selection gate 351 and the second selection gate 352. A first gate insulation layer 391 may be disposed between the first selection gate 351 and a surface of the first active region 331-1. A second gate insulation layer 392 may be disposed between the floating gate 340 and the surface of the first active region 331-1. A third gate insulation layer 393 may be disposed between the second selection gate 353 and the surface of the first active region 331-1.

The unit cell 11 may share the fourth junction region 374 with the unit cell 12, and the unit cell 11 and the unit cell 12 may have a symmetrical structure to the fourth junction region 374. Thus, the first to third junction regions 371, 372 and 373 of the unit cell 11 and the first to third junction regions 371, 372 and 373 of the unit cell 12 may be symmetric with respect to the fourth junction region 374. The first junction regions 371 of the unit cells 11 and 12 may be coupled to the source line SL. The fourth junction region 374 may be coupled to the first bit line BL0. The first and second selection gates 351 and 352 of the unit cell 11 may be coupled to the first word line WL0. The first and second selection gates 351 and 352 of the unit cell 12 may be coupled to the second word line WL1.

In order to selectively program the unit cell 11, the positive program voltage +Vpp may be applied to the first word line WL0 and the positive bit line program voltage +Vblp may be applied to the first bit line BL0. In addition, the source line SL and the first well region 310-1 may be grounded. The second word line WL1 connected to the unit cell 12 corresponding to a non-selected unit cell may be grounded. Since the first bit line BL0 is shared by the unit cells 11 and 12, both unit cells 11 and 12 may receive the positive bit line program voltage +Vblp through the first bit line BL0.

Under the above bias conditions, the unit cell 11 may be selectively programmed by a hot electron injection mechanism described with reference to FIGS. 4 and 5. However, in case of the unit cell 12 corresponding to a non-selected unit cell, even though the positive bit line program voltage +Vblp is applied to the first bit line BL0, the unit cell 12 may not be programmed because the second word line WL1 is grounded. Although both of the unit cells 11 and 12 share the first bit line BL0 to which the positive bit line program voltage +Vblp is applied, the second selection gate 352 of the non-selected unit cell 12 may prevent the positive bit line program voltage +Vblp applied to the first bit line BL0 from affecting the non-selected unit cell 12 during the program operation of the selected unit cell 11 because the second selection gate 352 of the non-selected unit cell 12 is disposed between the fourth junction region 374 coupled to the first bit line BL0 and the floating gate 340 of the non-selected unit cell 12. As a result, while the unit cell 11 is selectively programmed, the second selection gate 352 of the non-selected unit cell 12 may suppress a program disturbance phenomenon that hot electrons are undesirably injected into the floating gate 340 of the non-selected unit cell 12 by the positive bit line program voltage +Vblp applied to the first bit line BL0.

Figure 13:
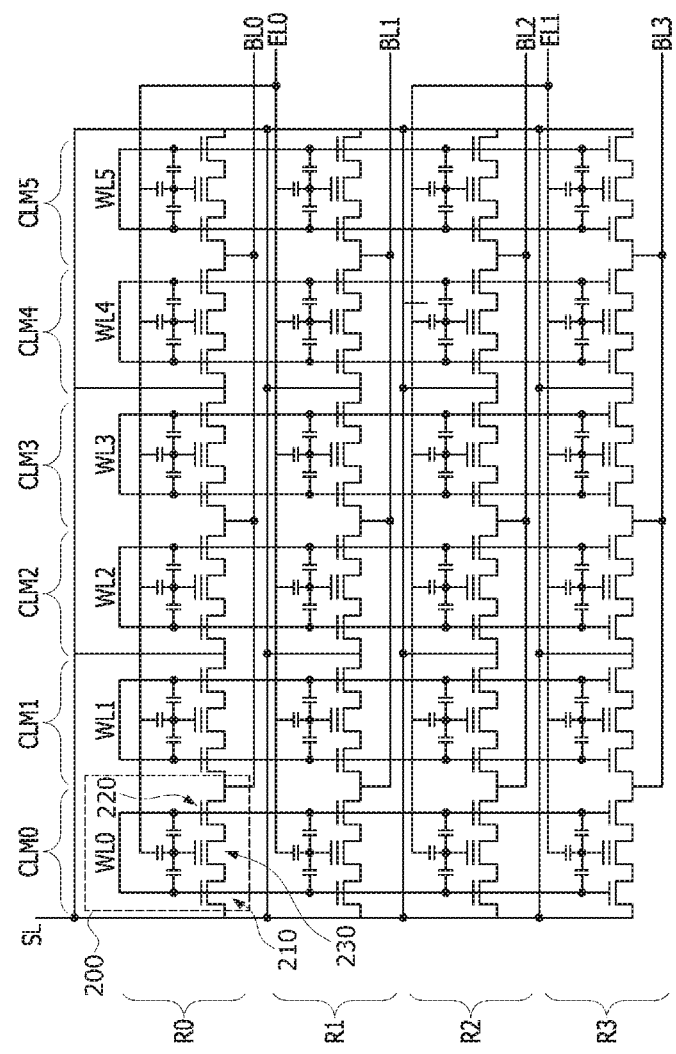
FIG. 13 is an equivalent circuit diagram of the cell array illustrated in FIG. 11.

FIG. 13 is an equivalent circuit diagram of the cell array 300 illustrated in FIG. 11. Referring to FIG. 13, the unit cell 200 illustrated in FIG. 10 may be repeatedly arrayed along the rows R0~R3 and the columns CLM0~CLM5 to have a matrix form. Each of the unit cells 200 illustrated in FIG. 13 may include the first selection transistor 210, the second selection transistor 220 and the storage transistor 230. Since each of the unit cells 200 illustrated in FIG. 13 has the same configuration as described with reference to FIG. 10, a detailed description of each unit cell 200 will be omitted hereinafter. The unit cells 200 arrayed in each column may share any one of the plurality of word lines (e.g., the first to sixth word lines WL0, WL1, WL2, WL3, WL4 and WL5). For example, the unit cells 200 arrayed in the first column CLM0 may share the first word line WL0. The unit cells 200 arrayed in each row may share any one of the plurality of bit lines (e.g., the first to fourth bit lines BL0, BL1, BL2 and BL3). For example, the unit cells 200 arrayed in the first row R0 may share the first bit line BL0. All the unit cells 200 in FIG. 13 may share the source line SL. The unit cells 200 arrayed in two adjacent rows (e.g., an odd row and an even row) may share any one the erasure lines (e.g., the first and second erasure lines EL0 and EL1). For example, the unit cells 200 arrayed in the first and second rows R0 and R1 may share the first erasure line EL0, and the unit cells 200 arrayed in the third and fourth rows R2 and R3 may share the second erasure line EL1.

For programming a selected unit cell, a positive program voltage and a positive bit line program voltage are applied to a word line and a bit line coupled to the selected unit cell, respectively while the remaining word lines are grounded, the remaining bit lines are grounded, and the source line SL is also grounded. For example, for programming the unit cell 20 located at a cross point of the first row R0 and the first column CLM0, the positive program voltage and the positive bit line program voltage may be applied to the first word line WL0 and the first bit line BL0, respectively. The remaining word lines (e.g., the second to sixth word lines WL1~WL5) and the remaining bit lines (e.g., the second to fourth bit lines BL1~BL3) may be grounded. Under the above bias conditions, the unit cell 200 located at a cross point of the first row R0 and the first column CLM0 may be selectively programmed. If the positive program voltage is applied to the first word line WL0, the positive program voltage may be applied to all the first and second selection gates of the unit cells 200 arrayed in the first column CLM0 through the first word line WL0. Nevertheless, the non-selected unit cells other than the selected unit cell among the unit cells in the first column CLM0 may not be programmed because the second to fourth bit lines BL1~BL3 are grounded. In addition, if the positive bit line program voltage is applied to the first bit line BL0, the positive bit line program voltage may be applied to all the fourth junction regions of the unit cells 200 arrayed in the first row R0 through the first bit line BL0. Nevertheless, the non-selected unit cells other than the selected unit cell among the unit cells in the first row R0 may not be programmed because the second to sixth word lines WL1~WL5 are grounded. Moreover, all the non-selected unit cells coupled to the grounded word lines and the grounded bit lines may not be programmed. For performing a read operation of the selected unit cell 200, only the positive program voltage and the positive bit line program voltage may be changed into a positive read voltage and a positive bit line read voltage, respectively.

Figure 14:
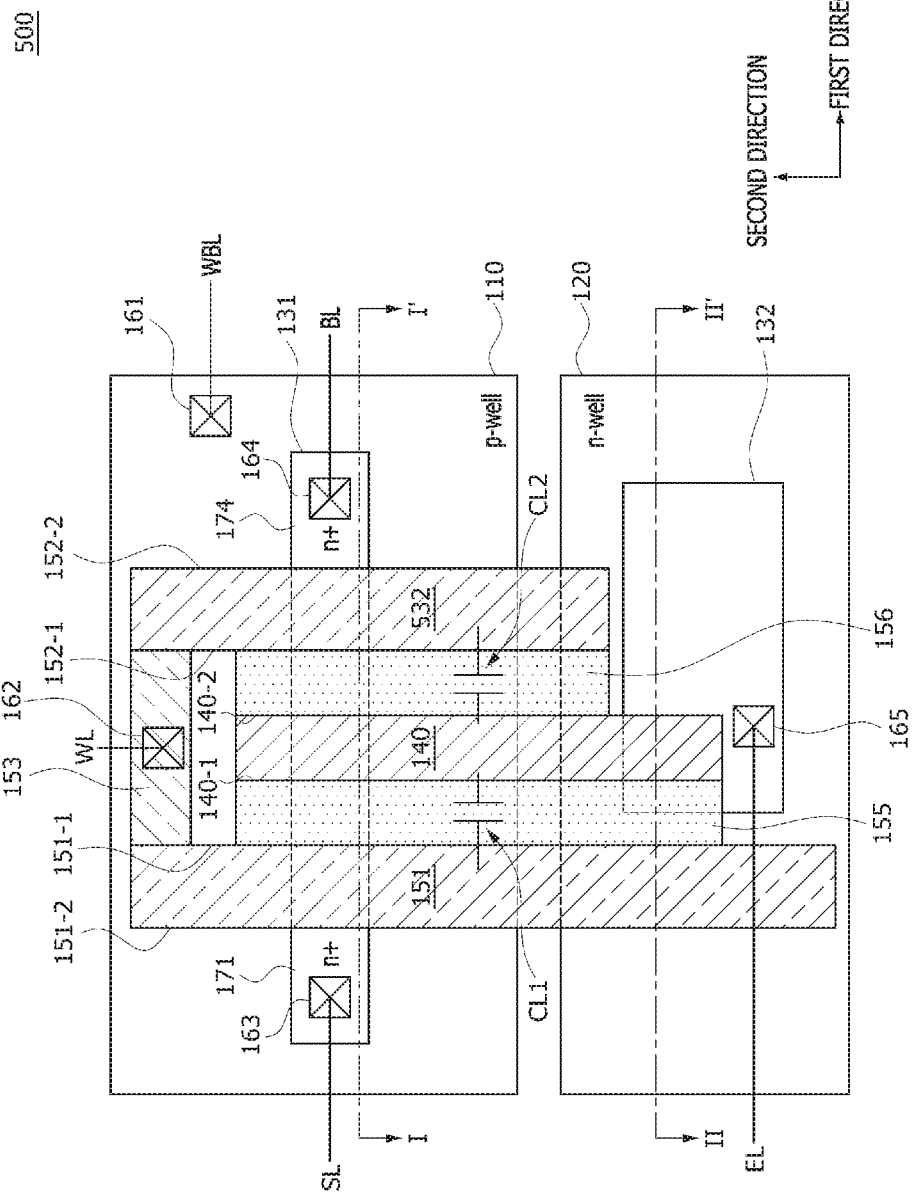
FIG. 14 is a layout diagram illustrating a unit cell of a nonvolatile memory device in accordance with an embodiment of the present disclosure.

FIG. 14 is a layout diagram illustrating a unit cell 500 of a nonvolatile memory device, in accordance with an embodiment of the present disclosure. In FIG. 14, the same reference numerals or the same reference characters as used in FIG. 1 denote the same elements. Thus, detailed descriptions of the same elements as set forth with reference to FIG. 1 will be omitted hereinafter to avoid a repeated description. Referring to FIG. 14, the unit cell 500 may have substantially the same configuration as the unit cell 100 illustrated in FIG. 1 except that a second selection gate 532 corresponding to the second selection gate 152 of FIG. 1 does not overlap with the second active region 132. In an embodiment, the second selection gate 532 may extend in the second direction to overlap with the second well region 120 without overlapping with the second active region 132. In another embodiment, although not shown in the drawings, the second selection gate 532 may be disposed without overlapping with both second well region 120 and the second active region 132. If the positive program voltage is applied to the word line WL to perform a program operation of the unit cell 500, the positive program voltage may be applied to both first and second selection gates 151 and 532. In such a case, since none of the first and second selection gates 151 and 532 overlap with the second active region 132, an electric potential of the second well region 120, which is floated, may be less affected by the positive program voltage. Thus, the program operation of the unit cell 500 may be more stable.

Figure 15:
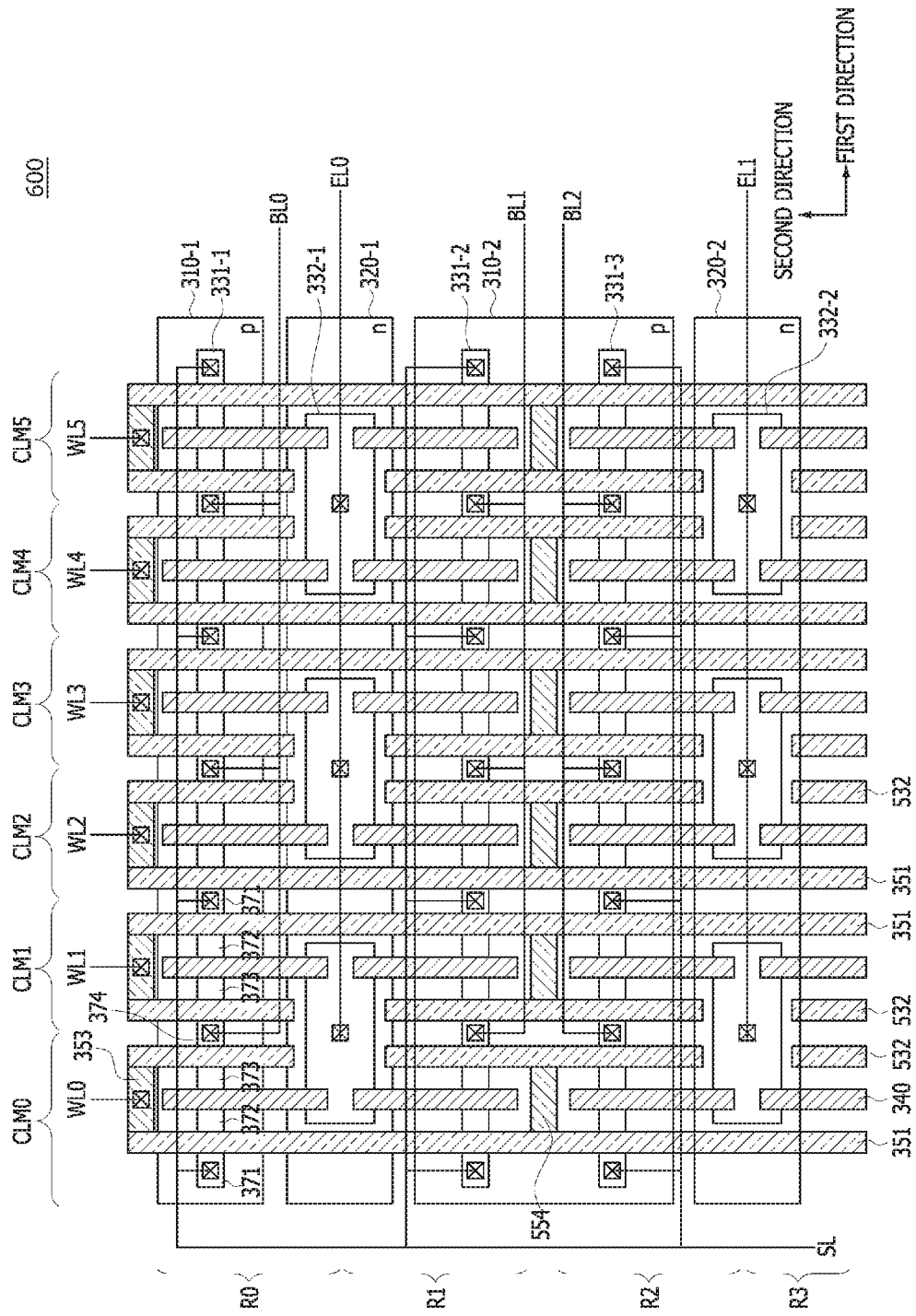
FIG. 15 is a layout diagram illustrating another example of a cell array of a nonvolatile memory device in accordance with an embodiment of the present disclosure.

FIG. 15 is a layout diagram illustrating a cell array 600 of a nonvolatile memory device, in accordance with another embodiment of the present disclosure. In FIG. 15, the same reference numerals or the same reference characters as used in FIG. 11 denote the same elements. Thus, detailed descriptions of the same elements as set forth with reference to FIG. 11 will be omitted hereinafter to avoid a repeated description. Referring to FIG. 15, the cell array 600 may include the second selection gates 532 instead of the second selection gates 352 illustrated in FIG. 11. As a result, none of the second selection gates 532 overlap with the second active regions 332-1 and 332-2. Thus, some of the second selection gates, for example, the second selection gate 532 shared by the unit cells located at two cross points of the first column CLM0 and the second and third rows R1 and R2 may be disconnected from the first select gate 351 disposed in the first column CLM0 to be electrically isolated. Accordingly, the cell array 600 may further include additional conductive connection lines 554, one of which electrically connects the first select gate 351 in the first column CLM0 to the isolated second selection gate 532 in the first column CLM0. As a result, a certain voltage is applied to any one of the word lines WL0~WL5, for example, the first word line WL0, the certain voltage may be applied to the first selection gate 351 in the first column CLM0 and may also be applied to the second selection gate 532 in the first column CLM0 through the conductive connection line 353 or the additional conductive connection line 554. As illustrated in FIGS. 14 and 15, since none of the second selection gates 532 overlap with the second active regions 332-1 and 332-2, an electric potential of the second well regions 320-1 and 320-2, which are floated, may be less affected by the positive program voltage applied to the word line coupled to a selected unit cell.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A nonvolatile memory device including a plurality of unit cells, each of the plurality of unit cells comprising:
   a first active region disposed in a substrate to extend in a first direction;
   a floating gate extending in a second direction to cross over the first active region;
   a first selection gate disposed to be adjacent to a first side surface of the floating gate to cross over the first active region;
   a second selection gate disposed to be adjacent to a second side surface of the floating gate opposite to the first selection gate to cross over the first active region;
   a first dielectric layer disposed between the first side surface of the floating gate and a first side surface of the first selection gate; and
   a second dielectric layer disposed between the second side surface of the floating gate and a first side surface of the second selection gate.

2. The nonvolatile memory device of claim 1, wherein the plurality of unit cells are located at cross points of a plurality of rows and a plurality of columns, respectively.

3. The nonvolatile memory device of claim 1, further comprising a conductive connection line that connects an end of the first selection gate to an end of the second selection gate,
wherein the conductive connection line does not overlap with the first active region and is disposed on an isolation layer surrounding the first active region.

4. The nonvolatile memory device of claim 1, further comprising:
a first junction region formed in one end of the first active region adjacent to a second side surface of the first selection gate opposite to the floating gate, wherein the first junction region is coupled to a source line;
a second junction region formed in the first active region between the first side surface of the first selection gate and the first side surface of the floating gate, wherein the second junction region is electrically floated;
a third junction region formed in the first active region between the second side surface of the floating gate and the first side surface of the second selection gate, wherein the third junction region is electrically floated; and
a fourth junction region formed in the other end of the first active region adjacent to a second side surface of the second selection gate opposite to the floating gate, wherein the fourth junction region is coupled to a bit line.

5. The nonvolatile memory device of claim 4, wherein the first to fourth junction regions are N-type junction regions.

6. The nonvolatile memory device of claim 4,
wherein the first and second selection gates are coupled to a word line; and
wherein each of the plurality of unit cells is programmed by applying a positive program voltage to the word line, applying a positive bit line program voltage to the bit line, and applying a ground voltage to the source line.

7. The nonvolatile memory device of claim 1, further comprising:
a first gate insulation layer disposed between the substrate and the floating gate;
a second gate insulation layer disposed between the substrate and the first selection gate; and
a third gate insulation layer disposed between the substrate and the second selection gate.

8. The nonvolatile memory device of claim 1, wherein a width of the first dielectric layer in the second direction is substantially equal to a width of the second dielectric layer in the second direction.

9. The nonvolatile memory device of claim 1, further comprising a second active region disposed to be spaced apart from the first active region and to overlap with the floating gate.

10. The nonvolatile memory device of claim 9, wherein the second active region overlaps with any one of the first and second selection gates.

11. The nonvolatile memory device of claim 9, wherein none of the first and second selection gates overlaps with the second active region.

12. The nonvolatile memory device of claim 9, further comprising:
a first well region disposed to surround the first active region and coupled to a well bias line; and
a second well region disposed to be spaced apart from the first well region in the second direction and disposed to surround the second active region,
wherein the second well region is coupled to an erasure line.

13. The nonvolatile memory device of claim 12, wherein the second well region has a conductivity type which is opposite to a conductivity type of the first well region.

14. The nonvolatile memory device of claim 12, wherein each of the plurality of unit cells is erased using a Fowler-Nordheim (F-N) tunneling mechanism by applying a positive erasure voltage to the erasure line.

15. The nonvolatile memory device of claim 1, further comprising:
a first well region and a second well region disposed in a substrate, the first well region having a conductivity type opposite to a conductivity type of the second well region, and
wherein the floating gate, the first dielectric layer, and the first selection gate overlap with each other along the first direction and provide a first lateral coupling capacitive component, and
wherein the floating gate, the second dielectric layer, and the second selection gate overlap with each other along the first direction and provide a second lateral coupling capacitive component.

16. A nonvolatile memory device including a plurality of unit cells which are respectively located at cross points of a plurality of rows and a plurality of columns, each of the plurality of unit cells comprising:
a first selection transistor having a source terminal coupled to a source line, a drain terminal coupled to a first junction terminal, and a first selection gate terminal coupled to a word line;
a second selection transistor having a source terminal coupled to a second junction terminal, a drain terminal coupled to a bit line, and a second selection gate terminal coupled to the word line;
a storage transistor having a floating gate terminal of a floated single-layer gate, a source terminal coupled to the first junction terminal, and a drain terminal coupled to the second junction terminal;
a vertical capacitive component having a first terminal coupled to the floating gate terminal and a second terminal coupled to an erasure terminal;
a first lateral coupling capacitive component having a first terminal coupled to the first selection gate terminal and a second terminal coupled to the floating gate terminal; and
a second lateral coupling capacitive component having a first terminal coupled to the second selection gate terminal and a second terminal coupled to the floating gate terminal.

17. The nonvolatile memory device of claim 16, wherein the first selection transistor, the second selection transistor and the storage transistor share a bulk region coupled to a well bias line.

18. The nonvolatile memory device of claim 17, wherein each of the plurality of unit cells is programmed by applying a positive program voltage to the word line, applying a positive bit line program voltage to the bit line, grounding the source line and the well bias line, and electrically floating the erasure line.

19. The nonvolatile memory device of claim 17, wherein each of the plurality of unit cells is erased by applying a positive erasure voltage to the erasure line and grounding all the word line, the source line, the bit line and the well bias line.

20. The nonvolatile memory device of claim 17, wherein a read operation of each of the plurality of unit cells is performed by applying a positive read voltage to the word line, applying a positive bit line read voltage to the bit line, grounding the source line and the well bias line, and electrically floating the erasure line.

* * * * *